United States Patent

Szabo et al.

[11] Patent Number: 4,567,450
[45] Date of Patent: Jan. 28, 1986

[54] FIN-LINE OSCILLATOR

[75] Inventors: Laszlo Szabo, Korntal; Klaus Schünemann, Braunschweig, both of Fed. Rep. of Germany

[73] Assignee: International Standard Electric Corporation, New York, N.Y.

[21] Appl. No.: 523,530

[22] Filed: Aug. 16, 1983

[30] Foreign Application Priority Data

Aug. 19, 1982 [DE] Fed. Rep. of Germany ....... 3230831

[51] Int. Cl.⁴ .......................... H03B 7/00; H01P 1/00
[52] U.S. Cl. .............................. 331/107 DP; 333/250
[58] Field of Search ................. 331/96, 103, 107 DP, 331/107 SL; 333/17, 222, 247, 250

[56] References Cited

FOREIGN PATENT DOCUMENTS 2755655  6/1979  Fed. Rep. of Germany ...... 331/107 DP Primary Examiner—Eugene LaRoche
Assistant Examiner—Gene Wan
Attorney, Agent, or Firm—John T. O'Halloran; Peter R. Ruzek

[57] ABSTRACT

The fin-line oscillator includes a packaged diode as an active element and an impedance-matching network for matching the diode to a load and determining the frequency.

In a first embodiment, the diode package (5) is mounted in a cutoff waveguide (4) connected with the waveguide (1) containing the fin line. The fins (2) of the fin line extend a given distance into the cutoff waveguide.

In further embodiments, the diode package is mounted in or on the substrate on which the fins of the fin line are deposited.

4 Claims, 4 Drawing Figures

FIN-LINE OSCILLATOR

BACKGROUND OF THE INVENTION

The present invention relates to a fin-line oscillator which comprises a diode as an active element which is housed in a package, and an impedance matching network for matching the diode to a load and determining the frequency.

An oscillator of this kind is disclosed in an article by R. Knöchel, "Design and Performance of Microwave Oscillators in Integrated Fin-Line Technique," IEE Journal MOA, May 1979, Vol. 3, No. 3, pp. 115-120.

There, the longitudinal axis of the package of the diode used as an active element runs parallel to the metal fins of the fin line. One end of the package must either be soldered directly to a metal fin or coupled to the fin by a resilient metallic strip.

This has the disadvantage that the metallic contact to the diode package must be made very carefully, and that quantity production is realizable only at high cost.

SUMMARY OF THE INVENTION

In the novel oscillator, the diode package is mounted in a simple manner. This solution is especially suited for quantity produciton. Accurate matching to the impedance of the load is possible. The frequency-determining parts of the arrangement can be easily implemented to suit the respective requirements.

BRIEF DESCRIPTION OF THE DRAWING

In all embodiments, good heat sinks are formed by the diode-package mounts selected.

Embodiments of the invention will now be explained in more detail with reference to the accompanying drawing, in which.

DETAILED DESCRIPTION OF THE PREFERRED EMBODIMENTS

Fin lines per se are generally known. Metal fins are so deposited on a dielectric substrate inside a waveguide that a slot is formed between them. There are various kinds of fin lines which differ essentially in the arrangement of the fins.

Figure 1A:
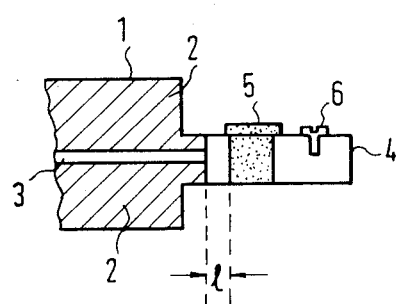
FIG. 1a shows a cross section through a first embodiment.

In the cross-sectional view of FIG. 1a, the waveguide 1 housing the fin line and the fins 2 deposited on the substrate are shown in the left-hand portion. The fins leave a slot 3 on the substrate. Connected with the waveguide 1 is a cutoff waveguide 4. Cutoff waveguides are waveguides operated in their cutoff regions, i.e., the cross section of the waveguide is chosen so that the waveguide cutoff frequency lies above the desired frequency of the oscillator. The fins 2 project a short distance into the cutoff waveguide.

The diode package 5, which contains the diode, is mounted in the cutoff waveguide in a manner known per se. To realize a given capacitance, the cutoff waveguide 4 contains a tuning screw 6, which, together with the package, provides a defined capacitance.

In the embodiment, the fin line is a unilateral fin line. The fins are symmetrical with respect to the slot. It is also possible to use other fin lines, e.g., a fin line where the slot is formed by only one fin and the wall of the waveguide.

Figure 1B:
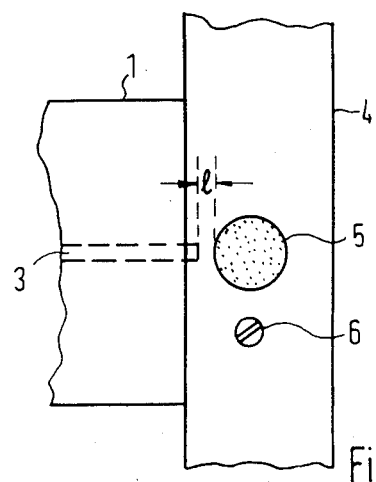
FIG. 1b is a top view of the first embodiment.

FIG. 1b shows this arrangement in a top view. The same reference characters as in FIG. 1a are used.

The fin-line oscillator works as follows:

In the equivalent circuit, the cutoff waveguide is represented by a pure inductance. Therefore, no undesired resonance effect can result from the incorporation of the active element. No wave propagation takes place in the region of the cutoff waveguide, so that the equivalent inductance can be regarded as a lumped circuit element. The width of the cutoff waveguide is chosen so that the desired frequency of oscillation is approximately ⅔ or less of the frequency of the dominant wave. Then, the equivalent inductance of the cutoff waveguide is nearly frequency-independent.

To generate the desired frequency, the complementary energy store, i.e., a capacitance, must be added. In the equivalent circuit, the point of extraction, i.e., the abrupt transition from the fin-line slot to the cutoff waveguide, represents a shunt capacitance. However, this capacitance is quite small because the metal fins are very thin (approx. 17.5 $\mu$m to approx. 35 $\mu$m). This does not suffice to compensate for the inductive reactance of the cutoff waveguide. An additional, larger capacitance is realized by the tuning screw in the cutoff waveguide. This also permits the frequency of the oscillator to be varied mechanically. The cutoff waveguide need not necessarily be closed metallically in its right-hand portion, because only aperiodically damped modes can exist there.

After this description of the frequency adjustment it will be described how tuning to the load is accomplished. To do this, the negative equivalent resistance of the active element must be matched to the load. The remaining degrees of freedom are, on the one hand, the slot width of the fin line and, on the other hand, the distance l between the end of the fin line and the package of the active element. This permits perfect matching in any case.

The supply voltage for the diode may be applied either through a coaxial low-pass filter in a manner known per se or—and this solution is very well suited to the structure—through a thin wire running from the open end of the cutoff waveguide to the diode. This open end must then be plugged with a damping material so that no radio-frequency power can escape there. This reduces the output power only negligibly (typically by 0.2 dB), while two additional advantages are gained: on the one hand, it increases the certainty of the start of oscillations, and on the other hand, the harmonic content of the output spectrum is reduced by typically 10 dB. If no mechanical tunability of the oscillator is desired, in a modification of the circuit, the tuning screw may be replaced with a metallic strip which is produced on a dielectric substrate material using a photoetching technique. To this end, one must imagine that, in FIG. 1a, the dielectric substrate, on which the fins are deposited in the left-hand portion is also present to the right of the active element. By etching away the unwanted portion of the copper cladding, a longitudinal, metallic strip can be formed which, if it is of suitable length and height, represents a capacitance. Thus, a purely planar structure has been realized, and the diode has been built in at low cost, in a reproducible manner, and with a good heat sink.

The oscillator can advantageously be made electronically tunable by adding a varactor diode. This may be done in two ways. A varactor diode in a normal package (e.g., S-4 package) may be fitted into the cutoff waveguide instead of or in addition to the tuning screw. The mounting is thus similar to that of the active element. A second possibility is to bond a varactor diode in a beam-lead package directly above the fin-line slot at a suitable point. Along the slot, points can be found where the varactor diode is coupled so closely that the electronic tuning range is on the order of percents. Then, however, the output power decreases by 1 to 3 dB. At other points, the coupling is only weak, so that a tuning range of the order of 3% of the rated frequency can be realized virtually without loss of output power.

Another embodiment will now be explained with the aid of FIG. 2a. Here, the diode package is mounted not in a waveguide but in the substrate on which the fins of the fin line are deposited.

Figure 2A:
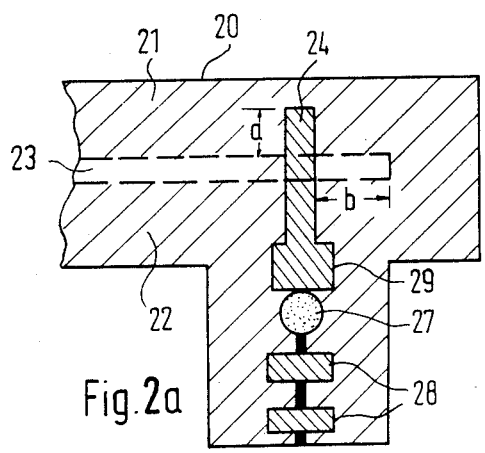
FIG. 2a is a schematic representation of a further embodiment.

In the schematic representation of FIG. 2a, metal films are deposited on the top and bottom sides of a dielectric substrate (not shown). The metal film on the bottom side of the substrate is indicated by a hatching from the lower left to the upper right, and that on the top side by a hatching from the upper left to the lower right.

On the bottom side of the substrate, the fins 21, 22 of the fin line form a slot 23. The substrate and the fins are enclosed in a waveguide 20. On the other side of the substrate and perpendicular to the direction of the slot, a stripline 24 is deposited on the substrate. It extends a distance a beyond the slot and is spaced a distance b from the end of the slot.

The diode package 27 is mounted in a hole in the substrate and electrically connected to the stripline 24. The supply voltage for the diode is applied through a stripline low pass filter 28.

In this arrangement, the stripline is coupled to the fin line via a strip-slot transition. If suitable lengths a and b are chosen, this transition represents a resonant circuit which determines the frequency. the matching of the real component of the diode impedance is accomplished by choosing a suitable value for the impedance of the fin line, i.e., by choosing a suitable slot width, and by means of a quarter-wave transformer 29 on the stripline directly in front of the diode. In this manner, the rated power of the active element can be coupled out at a frequency determined by a and b.

Figure 2B:
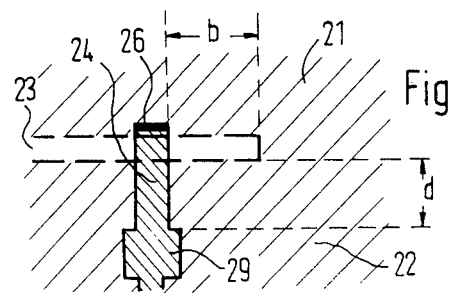
FIG. 2b is a schematic representation of yet another embodiment.

A development of this solution is shown in FIG. 2b.

In the arrangement of FIG. 2b, the length a is chosen to be very small, and the stripline is connected to the metal fin 21 on the other side of the substrate by a plated-through hole 26. In this case, the frequency-determining resonant circuit is determined by the length b (distance of the stripline from the end of the slot) and the distance d of the quarter-wave transformer 29 from the fin-line slot 23. The real component of the diode impedance is matched to the load in the same manner as in the embodiment of FIG. 2a.

Finally, a few remarks on the performance of the oscillator. With all structures it is possible to couple out the rated power of the diode. The external Q and, thus, the bandwidth are comparable with the values achieved using conventional waveguide techniques. Hence, noise is similarly low. The electronic tuning range of the first structure is typically 5 to 10%.

It was described which parameters form a resonant circuit or determine the frequency, and which parameters must be chosen to match the diode to the load. With this knowledge, those skilled in the art will be able to determine the actual lengths in any concrete case, so that this need not be described here.

We claim:

1. Fin-line oscillator comprising a waveguide containing a fin line having fins, a diode as an active element which is housed in a package (5), and an impedance-matching network for matching the diode to a load and determining the frequency, characterized in that the waveguide (1) containing the fin line is connected with a cutoff waveguide (4), that the fins (2) of the fin line extend into the cutoff waveguide (4), that the diode package (5) is disposed in the cutoff waveguide and electrically connected to the top or bottom side of the cutoff waveguide, and that a suitable distance (l) between the fin ends and the diode package and a suitable width of the slot between the fins as well as a suitable value of capacitance in the cutoff waveguide are chosen to determine the frequency and match the diode to the load.

2. Fin-line oscillator comprising a fin line including fins deposited on a substrate, a diode as an active element which is housed in a package (27), and an impedance-matching network for matching the diode to a load and determining the frequency, characterized in that the diode package (27) is mounted in the substrate on which the fins (21, 22) of the fin line are deposited, that a stripline (24) is deposited on the side of the substrate opposite the fins and at approximately right angles to the slot (23) formed by the fins, and that the diode package (27) is electrically connected to the stripline (24).

3. An oscillator as claimed in claim 2, characterized in that the stripline (24, FIG. 2b) reaches beyond the slot (23) of the fin line to the point that the stripline (24, 26) is electrically connected to the fin (21) on the opposite side of the substrate, that at a given distance (d) from the slot (23), the stripline forms a quarter-wave transformer (29), and that this given distance (d), the distance (b) of the stripline (24) from the end of the slot, and the slot width of the fin line are chosen in accordance with the desired frequency and the impedance of the load.

4. An oscillator as claimed in claim 2, characterized in 'that the stripline (24, FIG. 2a) reaches a given distance (a) beyond the slot (23), and that this given distance (a), the distance (b) of the stripline from the end of the slot, and the slot width of the fin line are chosen in accordance with the desired frequency and the impedance of the load.

* * * * *